(12) United States Patent
Cha et al.

(10) Patent No.: US 12,117,501 B2
(45) Date of Patent: Oct. 15, 2024

(54) BATTERY MANAGEMENT APPARATUS AND METHOD

(71) Applicant: LG Energy Solution, Ltd., Seoul (KR)

(72) Inventors: A-Ming Cha, Daejeon (KR); Yoon-Jung Bae, Daejeon (KR); Kyung-Hwa Woo, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 51 days.

(21) Appl. No.: 17/918,443

(22) PCT Filed: Oct. 27, 2021

(86) PCT No.: PCT/KR2021/015261
§ 371 (c)(1),
(2) Date: Oct. 12, 2022

(87) PCT Pub. No.: WO2022/092827
PCT Pub. Date: May 5, 2022

(65) Prior Publication Data
US 2023/0140094 A1 May 4, 2023

(30) Foreign Application Priority Data
Oct. 27, 2020 (KR) .................. 10-2020-0140726

(51) Int. Cl.
*G01R 31/396* (2019.01)
*G01R 31/3842* (2019.01)
*H01M 10/42* (2006.01)

(52) U.S. Cl.
CPC ....... *G01R 31/396* (2019.01); *G01R 31/3842* (2019.01); *H01M 2010/4271* (2013.01)

(58) Field of Classification Search
CPC .............. G01R 31/396; G01R 31/3842; G01R 31/3648; G01R 19/10; G01R 19/16542;
(Continued)

(56) References Cited

U.S. PATENT DOCUMENTS

2009/0295337 A1* 12/2009 Ishikawa ............. H01M 10/052
320/148
2013/0099794 A1 4/2013 Takahashi et al.
(Continued)

FOREIGN PATENT DOCUMENTS

JP 2003132960 A 5/2003
JP 5537236 B2 7/2014
(Continued)

OTHER PUBLICATIONS

Z. Khalik, H. J. Bergveld and M. C. F. Donkers, "Ageing-Aware Charging of Lithium-ion Batteries Using an Electrochemistry-Based Model with Capacity-Loss Side Reactions," 2020 American Control Conference (ACC), Denver, CO, USA, 2020, pp. 2213-2218 (Year: 2020).*

(Continued)

*Primary Examiner* — Daniel R Miller
(74) *Attorney, Agent, or Firm* — Bryan Cave Leighton Paisner LLP

(57) ABSTRACT

A battery management apparatus includes a measuring unit configured to measure a first voltage of a battery cell at a first time point and measure a second voltage and a second capacity of the battery cell at a second time point later than the first time point, and a control unit configured to calculate a voltage deviation between the first voltage and the second voltage, calculate a capacity deviation between a first capacity corresponding to the first voltage and the second capacity, determine a positive electrode side reaction factor and a negative electrode side reaction factor for the battery cell based on the voltage deviation and the capacity deviation, and judge the type of a side reaction of the battery cell based on the positive electrode side reaction factor and the negative electrode side reaction factor.

14 Claims, 6 Drawing Sheets

(58) Field of Classification Search
CPC ............. G01R 31/367; G01R 31/3835; H01M 2010/4271; H01M 10/052; H01M 10/425; H01M 10/48; Y02E 60/10
See application file for complete search history.

(56) References Cited

U.S. PATENT DOCUMENTS

| | | |
|---|---|---|
| 2018/0335479 A1 | 11/2018 | Hashimoto |
| 2019/0361076 A1 | 11/2019 | Koyamada et al. |
| 2020/0018799 A1 | 1/2020 | Lim et al. |
| 2020/0408846 A1 | 12/2020 | Bae et al. |
| 2021/0013731 A1 | 1/2021 | Choe et al. |

FOREIGN PATENT DOCUMENTS

| | | | |
|---|---|---|---|
| JP | 2015230817 A | 12/2015 | |
| JP | 201950094 A | 3/2019 | |
| JP | 6536687 B2 | 7/2019 | |
| JP | 2019203777 A | 11/2019 | |
| JP | 6638227 B2 | 1/2020 | |
| KR | 20190036982 A | 4/2019 | |
| KR | 20190118534 A | 10/2019 | |
| KR | 20200069203 A | 6/2020 | |
| WO | 2008154960 A1 | 12/2008 | |
| WO | WO-2015019427 A1 * | 2/2015 | ............ H01M 10/44 |

OTHER PUBLICATIONS

International Search Report for Application No. PCT/KR2021/015261 mailed Feb. 28, 2022, pp. 1-3.

* cited by examiner

BATTERY MANAGEMENT APPARATUS AND METHOD

CROSS-REFERENCE TO RELATED APPLICATIONS

The present application is a national phase entry under 35 U.S.C. § 371 of International Application No. PCT/KR2021/015261 filed Oct. 27, 2021, which claims priority from Korean Patent Application No. 10-2020-0140726 filed Oct. 27, 2020, all of which are incorporated herein by reference.

TECHNICAL FIELD

The present disclosure relates to a battery management apparatus and method, and more particularly, to a battery management apparatus and method capable of judging the type of a side reaction generated in a battery cell and setting an operating condition of the battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

If the battery is exposed to high temperature, side reactions may occur at the positive electrode and the negative electrode, so that available lithium may be lost and internal gas may be generated and vented. In addition, in the prior art, just the degradation rate of the battery may be estimated using the capacity retention rate information (e.g., irreversible capacity information) of the battery, but there is a problem that the type of side reaction generated in the battery could not be specified using the capacity retention rate information.

SUMMARY

Technical Problem

The present disclosure is designed to solve the problems of the related art, and therefore the present disclosure is directed to providing a battery management apparatus and method that may be judge the type of side reaction generated in a battery based on voltage deviation and capacity deviation of the battery at different time points, and appropriately set the operating condition of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery management apparatus according to one aspect of the present disclosure may comprise: a voltage sensor configured to measure a first voltage of a battery cell at a first time point and a second voltage of the battery cell at a second time point later than the first time point; a current sensor configured to measure a current of the battery cell; a controller and memory having programmed thereon instructions that, when executed by the controller, cause the controller to: receive from the current sensor a measurement of a capacity of the battery cell at the second time point; calculate a voltage deviation between the first voltage and the second voltage; calculate a capacity deviation between a first capacity corresponding to the first voltage and the second capacity; determine a positive electrode side reaction factor and a negative electrode side reaction factor for the battery cell based on the voltage deviation and the capacity deviation; and determine a type of a side reaction of the battery cell based on the positive electrode side reaction factor and the negative electrode side reaction factor.

The instructions may be configured to cause the controller to calculate a voltage-based capacity corresponding to the voltage deviation based on a battery profile representing a corresponding relationship between state of charge (SOC) and voltage of the battery cell, and determine the positive electrode side reaction factor based on the voltage-based capacity.

The instructions may be configured to cause the controller to estimate a first SOC corresponding to the first voltage; and determine the positive electrode side reaction factor of the battery cell to be a difference between the estimated first SOC and a preset threshold SOC.

The instructions may be configured to cause the controller to in response to the first SOC being equal to or greater than the threshold SOC, determine the positive electrode side reaction factor is the voltage-based capacity.

The instructions may be configured to cause the controller to in response to the first SOC being less than the threshold SOC, determine the positive electrode side reaction factor based on a difference between the voltage-based capacity and the capacity deviation.

The instructions may be configured to cause the controller to set the threshold SOC in a differential profile representing a corresponding relationship between the SOC of the battery cell and a differential voltage for the SOC at a point of the differential profile at which a negative electrode flat section starts.

The instructions may be configured to cause the controller to determine a target peak included in a predetermined SOC section in the differential profile, and set the threshold SOC to the determined target peak.

The instructions may be configured to cause the controller to determine the negative electrode side reaction factor for the battery cell based on the capacity deviation.

The instructions may be configured to cause the controller to calculate a side reaction reference value based on the positive electrode side reaction factor and the negative electrode side reaction factor, compare the calculated side reaction reference value with a preset side reaction threshold value, and determine the type of the side reaction of the battery cell to be one of a positive electrode side reaction or a negative electrode side reaction based on the comparison.

The instructions may be configured to cause the controller to set an operating condition for the battery cell, based on the determined type of the side reaction of the battery cell.

The instructions may be configured to cause the controller to reduce at least one of an upper limit SOC or an upper limit voltage for the battery cell in response to the determined type of the side reaction of the battery cell being the positive electrode side reaction.

The instructions may be configured to cause the controller to reduce an upper limit temperature for the battery cell in response to the determined type of the side reaction of the battery cell being the negative electrode side reaction.

A battery management apparatus according to another aspect of the present disclosure may further comprise a discharging unit configured to discharge the battery cell at the second time point.

The current sensor may be configured to measure the second capacity by measuring a discharging current amount of the battery cell at the second time point while the battery cell is being discharged.

The apparatus may be configured to maintain the battery cell at a predetermined temperature or above from the first time point to the second time point.

A battery pack according to still another aspect of the present disclosure may comprise the battery management apparatus according to an aspect of any of the embodiments of the present disclosure.

A battery managing method according to still another aspect of the present disclosure may comprise: measuring, by a voltage sensor, a first voltage of a battery cell at a first time point and a second voltage of the battery at a second time point later than the first time point; measuring, by a current sensor, a current of the battery cell; receiving, by a controller, a measurement of a capacity of the battery cell at the second time point from the current sensor; calculating, by the controller, a voltage deviation between the first voltage and the second voltage; calculating, by the controller, a capacity deviation between a first capacity corresponding to the first voltage and the second capacity; determining, by the controller, a positive electrode side reaction factor and a negative electrode side reaction factor for the battery cell based on the voltage deviation and the capacity deviation; and determining, by the controller, a type of a side reaction of the battery cell based on the positive electrode side reaction factor and the negative electrode side reaction factor.

Advantageous Effects

According to one aspect of the present disclosure, there is an advantage that the type of side reaction generated in the battery cell may be judged based on the voltage deviation of the battery cell and the capacity deviation of the battery cell at both time points.

In addition, according to one aspect of the present disclosure, there is an advantage that an optimal operating condition for the battery cell may be set to correspond to the type of side reaction judged for the battery cell.

The effects of the present disclosure are not limited to the effects mentioned above, and other effects not mentioned will be clearly understood by those skilled in the art from the description of the claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
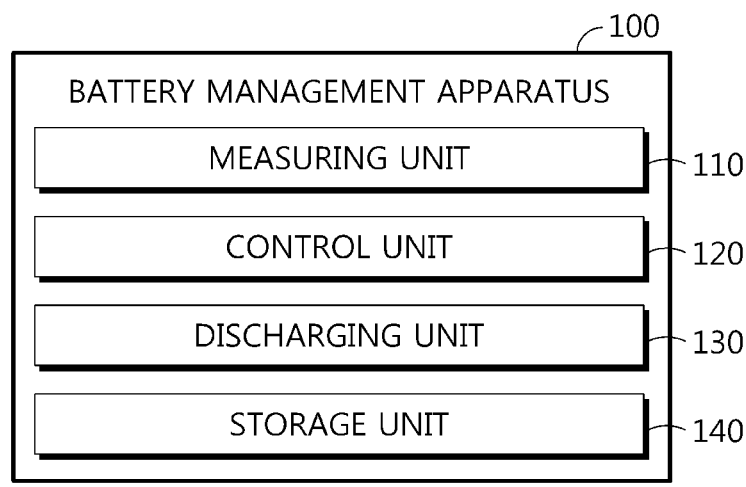
FIG. 1 is a diagram schematically showing a battery management apparatus according to an embodiment of the present disclosure.

FIG. 1 is a diagram schematically showing a battery management apparatus 100 according to an embodiment of the present disclosure.

Referring to FIG. 1, the battery management apparatus 100 according to an embodiment of the present disclosure may include a measuring unit 110 and a control unit 120.

The measuring unit 110 may be configured to measure a first voltage of a battery cell at a first time point T1, and to measure a second voltage and a second capacity of the battery cell at a second time point T2 later than the first time point T1.

Here, the battery means one physically separable independent cell including a negative electrode terminal and a positive electrode terminal. For example, one lithium-ion battery or one lithium polymer battery may be regarded as a battery.

In addition, the second time point T2 is a time point different from the first time point T1, and may be a time point after a predetermined time passes from the first time point T1. That is, after measuring the voltage (first voltage) of the battery cell at the first time point T1, the measuring unit 110 may measure the voltage (second voltage) and capacity (second capacity) of the battery cell at the second time point T2.

For example, the first time point T1 may be a time point at which storage of the battery cell starts, and the second time point T2 may be a time point at which storage of the battery cell is terminated. The measuring unit 110 may measure the voltage of the battery cell at a storage start time point and a storage end time point of the battery cell, and measure the remaining capacity of the battery cell at the storage end time point.

Preferably, the measuring unit 110 may measure an open circuit voltage (OCV) of the battery cell at the first time point T1 and the second time point T2.

Figure 2:
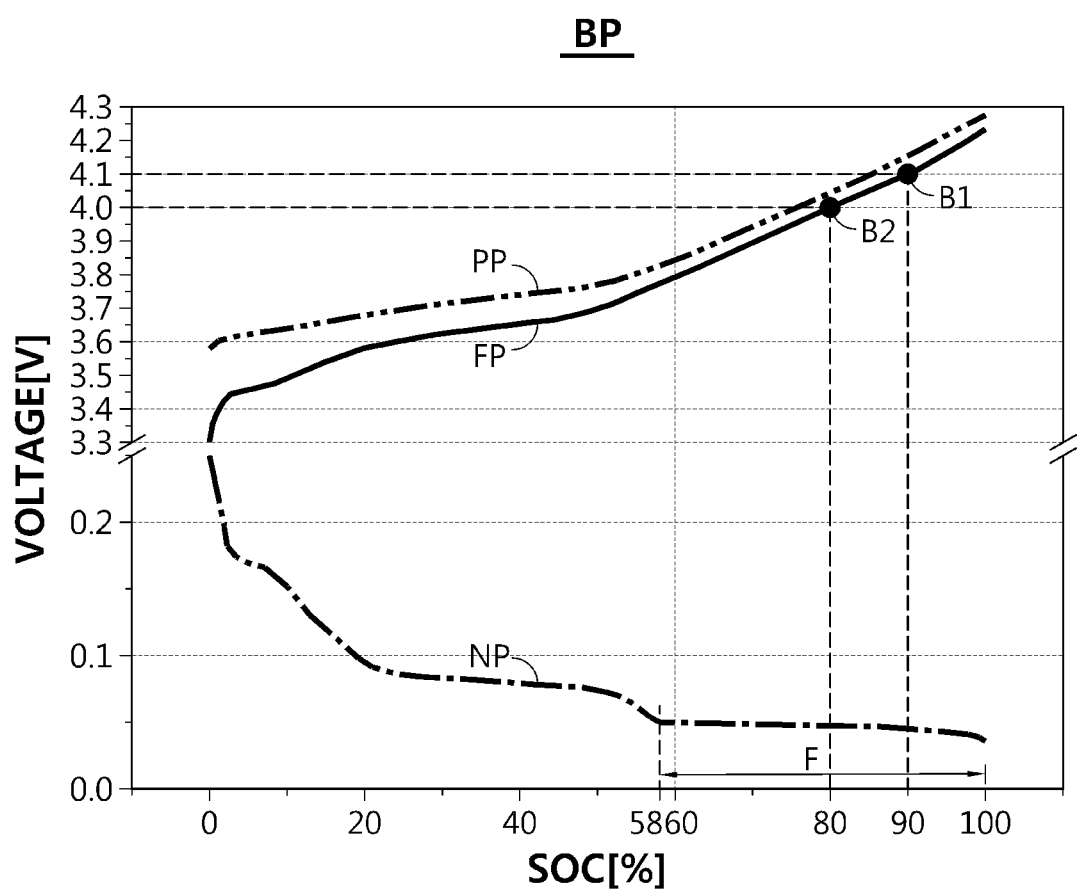
FIG. 2 is a diagram schematically showing a battery profile according to an embodiment of the present disclosure.

FIG. 2 is a diagram schematically showing a battery profile BP according to an embodiment of the present disclosure. Here, the battery profile BP may include a full cell profile FP, a positive electrode profile PP, and a negative electrode profile NP for the battery cell. The full cell profile FP is a profile representing the corresponding relationship between voltage and state of charge (SOC) of the battery cell. The positive electrode profile PP is a profile representing the corresponding relationship between a positive electrode voltage of the battery cell and the SOC of the battery cell. The negative electrode profile NP is a profile representing the corresponding relationship between a negative electrode voltage of the battery cell and the SOC of the battery cell.

For example, in the embodiment of FIG. 2, B1 may be a battery cell at the first time point T1, and B2 may be a battery cell at the second time point T2. The measuring unit 110 may measure the first voltage of the battery cell B1 at the first time point T1 as 4.1 [V], and measure the second voltage of the battery cell B2 at the second time point T2 as 4.0 [V].

The control unit 120 may be configured to calculate a voltage deviation between the first voltage and the second voltage.

Specifically, the control unit 120 may be connected to the measuring unit 110 to communicate in wire and/or wireless manner. In addition, the control unit 120 may receive the first voltage and the second voltage from the measuring unit 110, and calculate a voltage deviation between the received first voltage and the received second voltage.

For example, the control unit 120 may calculate the voltage deviation by calculating a formula of "first voltage−second voltage". In the embodiment of FIG. 2, the control unit 120 may calculate a formula of "4.1 [V]−4.0 [V]" to calculate the voltage deviation as 0.1 [V].

The control unit 120 may be configured to calculate a capacity deviation between a first capacity corresponding to the first voltage and the second capacity.

For example, the control unit 120 may calculate the capacity deviation by calculating a formula of "first capacity−second capacity".

Specifically, the control unit 120 may estimate a first SOC corresponding to the first voltage by using the battery profile BP. In addition, the control unit 120 may calculate the first capacity corresponding to the first voltage by using the capacity (e.g., the rated capacity of the battery cell) for the battery cell in the BOL (Beginning of life) state and the estimated first SOC. For example, when the capacity of the BOL battery cell is Q0 and the estimated first SOC is 90%, the control unit 120 may calculate "Q0×0.9" as the first capacity.

In addition, the second capacity of the battery cell may be the remaining capacity of the battery cell at the second time point T2. To this end, referring to FIG. 1 again, the battery management apparatus 100 according to an embodiment of the present disclosure may further include a discharging unit 130.

The discharging unit 130 may be provided in the battery management apparatus 100, and its operating state may be controlled by the control unit 120. In addition, if the discharging unit 130 receives a discharging command for the battery cell from the control unit 120, the discharging unit 130 may be configured to form a discharging path capable of discharging the battery cell. For example, the discharging unit 130 may include a resistor (not shown) and a switching element (not shown), and if the switching element is controlled to a turn-on state by the control unit 120, the battery cell may be discharged. Thereafter, if the switching element is controlled to a turn-off state by the control unit 120, discharge of the battery cell may be terminated.

Here, any device whose operating state can be controlled by the control unit 120 may be applied to the switching element without limitation. For example, a contactor, a relay, a field effect transistor (FET), or a metal oxide semiconductor field effect transistor (MOSFET) may be applied to the switching element.

The measuring unit 110 may be configured to measure the second capacity by measuring a discharging current amount of the battery cell while the battery cell is being discharged at the second time point T2. For example, the measuring unit 110 may measure the second capacity of the battery cell by accumulating the discharging current amount output from the battery cell while the battery cell is being discharged.

Figure 3:
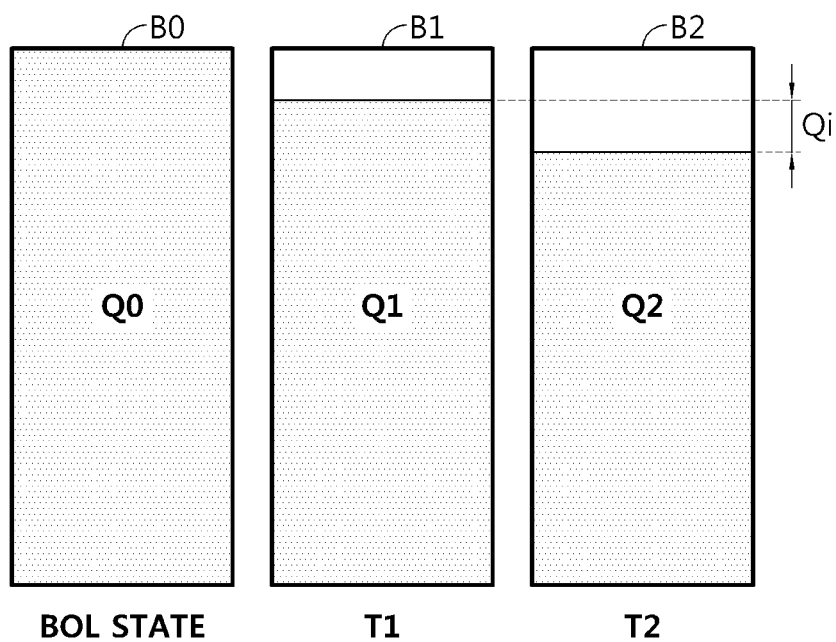
FIG. 3 is a diagram schematically showing the change in capacity at each time point of the battery cell according to an embodiment of the present disclosure.

FIG. 3 is a diagram schematically showing the change in capacity at each time point of the battery cell according to an embodiment of the present disclosure.

In the embodiment of FIG. 3, B0 may be a battery cell in the BOL state, and Q0 may be a maximum capacity of the battery cell B0 in the BOL state. B1 may be a battery cell at the first time point T1, and Q1 may be the capacity of the battery cell B1 at the first time point T1. B2 may be a battery cell at the second time point T2, and Q2 may be the capacity of the battery cell B2 at the second time point T2. For example, the first capacity preset for the battery cell may be Q0, and the second capacity of the battery cell may be Q3. Here, the units of Q0, Q1, and Q2 may be [mAh].

In addition, the control unit 120 may be configured to calculate a capacity deviation Qi based on a difference between the first capacity and the second capacity of the battery cell. Specifically, the control unit 120 may calculate the formula of "first capacity−second capacity" to calculate the capacity deviation Qi of the battery cell.

For example, in the embodiment of FIG. 3, the control unit 120 may calculate the formula of "Q1−Q2" to calculate the capacity deviation Qi of the battery cell.

The control unit 120 may be configured to determine a positive electrode side reaction factor and a negative electrode side reaction factor for the battery cell based on the voltage deviation and the capacity deviation.

Here, the positive electrode side reaction factor may be a numerical value of the positive electrode side reaction generated in the battery cell, and the negative electrode side reaction factor may be a numerical value of the negative electrode side reaction generated in the battery cell. In addition, the positive electrode side reaction factor and the negative electrode side reaction factor are values related to the capacity of the battery cell, and their unit may be [mAh], which is the same as the capacity unit of the battery cell.

For convenience of description, a specific embodiment in which the control unit 120 determines the positive electrode side reaction factor and the negative electrode side reaction factor for the battery cell based on the voltage deviation and the capacity deviation will be described later.

Finally, the control unit 120 may be configured to judge the type of a side reaction of the battery cell based on the positive electrode side reaction factor and the negative electrode side reaction factor.

Specifically, the control unit 120 may judge the type of the side reaction that occurs more in the battery cell in consideration of the positive electrode side reaction factor and the negative electrode side reaction factor.

For example, the control unit 120 may specifically distinguish and diagnose the type of the side reaction that occurs more in the battery cell by comparing the calculated positive electrode side reaction factor and the calculated negative electrode side reaction factor.

Specifically, the control unit 120 may be configured to calculate a side reaction reference value based on the positive electrode side reaction factor and the negative electrode side reaction factor.

For example, the control unit 120 may calculate a formula of "positive electrode side reaction factor÷negative electrode side reaction factor" to calculate the side reaction reference value.

In addition, the control unit 120 may compare the calculated side reaction reference value with a preset side reaction criterion value.

Here, the side reaction criterion value is a preset value, and may be a value indicating a criterion for distinguishing the type of the side reaction of the battery cell as the positive electrode side reaction or the negative electrode side reaction according to the side reaction reference value. For example, the side reaction criterion value may be preset to 0.5.

Finally, the control unit 120 may be configured to judge the type of the side reaction of the battery cell as the positive electrode side reaction or the negative electrode side reaction according to the comparison result for the side reaction reference value and the side reaction criterion value.

For example, if the side reaction reference value is greater than or equal to a criterion value, the control unit 120 may judge the type of the side reaction of the battery cell as the positive electrode side reaction. As another example, if the side reaction reference value is less than the criterion value, the control unit 120 may judge the type of the side reaction of the battery cell as the negative electrode side reaction.

In the previous embodiment, it has been described that the control unit 120 judges the type of the side reaction of the battery cell by using the ratio of the positive electrode side reaction factor to the negative electrode side reaction factor, but it should be noted that the control unit 120 may also judge the type of the side reaction of the battery cell based on the comparison between the difference value of the positive electrode side reaction factor and the negative electrode side reaction factor and a preset another criterion value.

The causes of the positive electrode side reaction and the negative electrode side reaction generated in the battery cell may be different, and the operating conditions for preventing side reactions from occurring further may be different. Therefore, the battery management apparatus 100 according to an embodiment of the present disclosure has an advantage of specifically judging the type of the side reaction generated in the battery cell, based on the voltage deviation of the battery cell and the capacity deviation $Q_i$ of the battery cell at both time points (first time point T1 and second time point T2).

Meanwhile, the control unit 120 provided in the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 120 may be implemented as a set of program modules. At this time, the program module may be stored in a memory and executed by the control unit 120. The memory may be located inside or out of the control unit 120 and may be connected to the control unit 120 by various well-known means.

In addition, referring to FIG. 1, the battery management apparatus 100 may further include a storage unit 140. The storage unit 140 may store data necessary for operation and function of each component of the battery management apparatus 100, data generated in the process of performing the operation or function, or the like. The storage unit 140 is not particularly limited in its kind as long as it is a known information storage means that can record, erase, update and read data. As an example, the information storage means may include random-access memory (RAM), flash memory, read-only memory (ROM), electrically erasable programmable read-only memory (EEPROM), registers, and the like. In addition, the storage unit 140 may store program codes in which processes executable by the control unit 120 are defined.

For example, the storage unit 140 may store the battery profile BP according to the embodiment of FIG. 2 in advance. In addition, the storage unit 140 may store the BOL capacity Q0 of the battery cell B0 in the BOL state, the voltage and capacity Q1 of the battery cell B1 at the first time point T1, the voltage and the capacity Q2 of the battery cell B2 at the second time point T2, and the like according to the embodiment of FIG. 3.

Hereinafter, an embodiment in which the control unit 120 calculates a voltage-based capacity from the voltage deviation of the voltage of the battery cell B1 at the first time point T1 and the voltage of the battery cell B2 at the second time point T2 will be described.

The control unit 120 may be configured to calculate a voltage-based capacity corresponding to the voltage deviation based on the battery profile BP representing the corresponding relationship between the SOC and the voltage of the battery cell.

First, the control unit 120 may estimate a first SOC corresponding to the voltage of the battery cell B1 at the first time point T1 and a second SOC corresponding to the voltage of the battery cell B2 at the second time point T2, based on the battery profile BP. For example, in the embodiment of FIG. 2, the control unit 120 may estimate the first SOC corresponding to the first voltage (4.1 [V]) of the battery cell B1 at the first time point T1 as 90%. In addition, the control unit 120 may estimate the second SOC corresponding to the second voltage (4.0 [V]) of the battery cell B2 at the second time point T2 as 80%.

Next, the control unit 120 may calculate a SOC deviation between the first SOC corresponding to the voltage of the battery cell B1 at the first time point T1 and the second SOC corresponding to the voltage of the battery cell B2 at the second time point T2. For example, in the embodiment of FIG. 2, the control unit 120 may calculate the SOC deviation between the first SOC (90%) and the second SOC (80%) as 10%.

Finally, the control unit 120 may calculate the voltage-based capacity corresponding to the SOC deviation based on the BOL capacity Q0 of the BOL battery cell B0. For example, in the embodiment of FIG. 2, the control unit 120 may calculate the voltage-based capacity corresponding to the SOC deviation (10%) based on the BOL capacity Q0 of the BOL battery cell B0.

Alternatively, the control unit 120 may calculate the capacity corresponding to the first SOC of the battery cell B1 at the first time point T1 and the capacity corresponding to the second SOC of the battery cell B2 at the second time point T2, respectively. In addition, the control unit 120 may calculate the voltage-based capacity by calculating a difference between the capacity corresponding to the first SOC and the capacity corresponding to the second SOC.

Hereinafter, an embodiment in which the control unit 120 determines the positive electrode side reaction factor will be described first.

The control unit 120 may be configured to determine the positive electrode side reaction factor based on the voltage-based capacity or the voltage-based capacity and the capacity deviation Qi according to the first voltage.

Specifically, the control unit 120 may estimate the first SOC corresponding to the first voltage.

For example, the first voltage may be a voltage value measured by the measuring unit 110 as the voltage of the battery cell B1 at the first time point T1. In addition, the control unit 120 may estimate the first SOC corresponding to the first voltage by using the battery profile BP.

The control unit 120 may compare the estimated first SOC with a preset criterion SOC.

Here, the criterion SOC may be preset as a SOC that starts not to be affected by the negative electrode of the battery cell. For example, in the embodiment of FIG. 2, it may be confirmed that the negative electrode voltage hardly changes within an approximate range in the SOC section of SOC 58% or more. That is, SOC 58% may be preset as the criterion SOC. A detailed description of the control unit 120 setting the criterion SOC will be described later.

The control unit 120 may be configured to determine the positive electrode side reaction factor of the battery cell to correspond to the comparison result of the first SOC and the criterion SOC.

Specifically, if the first SOC is greater than or equal to the criterion SOC, the control unit 120 may be configured to determine the positive electrode side reaction factor based on the voltage-based capacity corresponding to the voltage deviation.

For example, in the embodiment of FIG. 2, in the SOC section equal to or greater than the criterion SOC (SOC 58%), even if the SOC changes, the negative electrode voltage hardly changes, so it may be regarded that the positive electrode side reaction factor affects the battery cell. Accordingly, if the first SOC of the battery cell B1 at the first time point T1 is equal to or greater than the criterion SOC, the control unit 120 may determine the positive electrode side reaction factor as the voltage-based capacity corresponding to the voltage deviation between the first voltage and the second voltage.

Conversely, if the first SOC is less than the criterion SOC, the control unit 120 may determine the positive electrode side reaction factor based on the difference between the voltage-based capacity corresponding to the voltage deviation and the negative electrode side reaction factor. Specifically, the control unit 120 may be configured to determine the positive electrode side reaction factor based on the difference between the voltage-based capacity corresponding to the voltage deviation and the calculated capacity deviation Qi.

For example, in the embodiment of FIG. 2, in the SOC section less than the criterion SOC (SOC 58%), since both the negative electrode voltage and the positive electrode voltage change according to the SOC change, it may be regarded that the positive electrode side reaction factor and the negative electrode side reaction factor affects the battery cell.

Therefore, when the first SOC of the battery cell B1 at the first time point T1 belongs to the SOC section less than the criterion SOC, in order to determine the positive electrode side reaction factor, the control unit 120 may determine the value obtained by subtracting the capacity deviation Qi affected by the negative electrode side reaction from the voltage-based capacity affected by the positive electrode side reaction as the positive electrode side reaction factor. For example, the control unit 120 may calculate a formula of "voltage-based capacity−capacity deviation Qi" to determine the positive electrode side reaction factor.

In other words, if the first SOC of the battery cell B1 at the first time point T1 is less than the criterion SOC, both the positive electrode side reaction and the negative electrode side reaction may affect the battery cell. Therefore, the control unit 120 may determine the value obtained by subtracting the capacity deviation Qi caused by the negative electrode side reaction from the voltage-based capacity calculated based on the voltage deviation at the first time point T1 and the second time point T2 as the positive electrode side reaction factor.

The battery management apparatus 100 according to an embodiment of the present disclosure has an advantage of determining the positive electrode side reaction factor that may more accurately represent the positive electrode side reaction by using the SOC of the battery cell B1 at the first time point T1 in the process of determining the positive electrode side reaction factor. Therefore, the battery management apparatus 100 has an advantage of more accurately judging the type of the side reaction of the battery cell based on the comparison result of the positive electrode side reaction factor and the negative electrode side reaction factor.

Hereinafter, among the above-described contents, the contents in which the control unit 120 sets the criterion SOC will be described in more detail.

Specifically, the control unit 120 may be configured to acquire a battery profile BP representing the corresponding relationship between the SOC of the battery cell and the voltage of the battery cell. For example, the control unit 120 may acquire the battery profile BP stored in the storage unit 140. As another example, the control unit 120 may store the battery profile BP in its internal memory or may receive the battery profile BP from the outside.

The control unit 120 may be configured to set the SOC at the point where a negative electrode flat section F of the battery cell starts as the criterion SOC in the acquired battery profile BP.

Here, the negative electrode flat section F may mean a section in which the negative electrode voltage of the battery cell is the same or changes within a predetermined range even if the SOC of the battery cell is increased in the negative electrode profile NP of the battery cell. That is, the negative electrode flat section F means a section in which the negative electrode voltage does not change or hardly changes even when the SOC of the battery cell is increased. The negative electrode flat section F may appear at about SOC 50% or more.

For example, in the embodiment of FIG. 2, referring to the negative electrode profile NP, the negative electrode flat section F may be SOC 58% to 100%. Accordingly, the control unit 120 may set SOC 58%, which is a point where the negative electrode flat section F starts, as the criterion SOC.

Meanwhile, the control unit 120 may more accurately set the criterion SOC based on a differential profile representing the corresponding relationship between the SOC of the battery cell and the differential voltage.

Here, the differential voltage may be an instantaneous change rate of voltage with respect to SOC. That is, the differential voltage is a differential value of voltage with respect to SOC, and may be expressed as dV/dSOC. In addition, the differential profile may be expressed as an X-Y graph, when X is set as the SOC and Y is set as the differential voltage (dV/dSOC).

Figure 4:
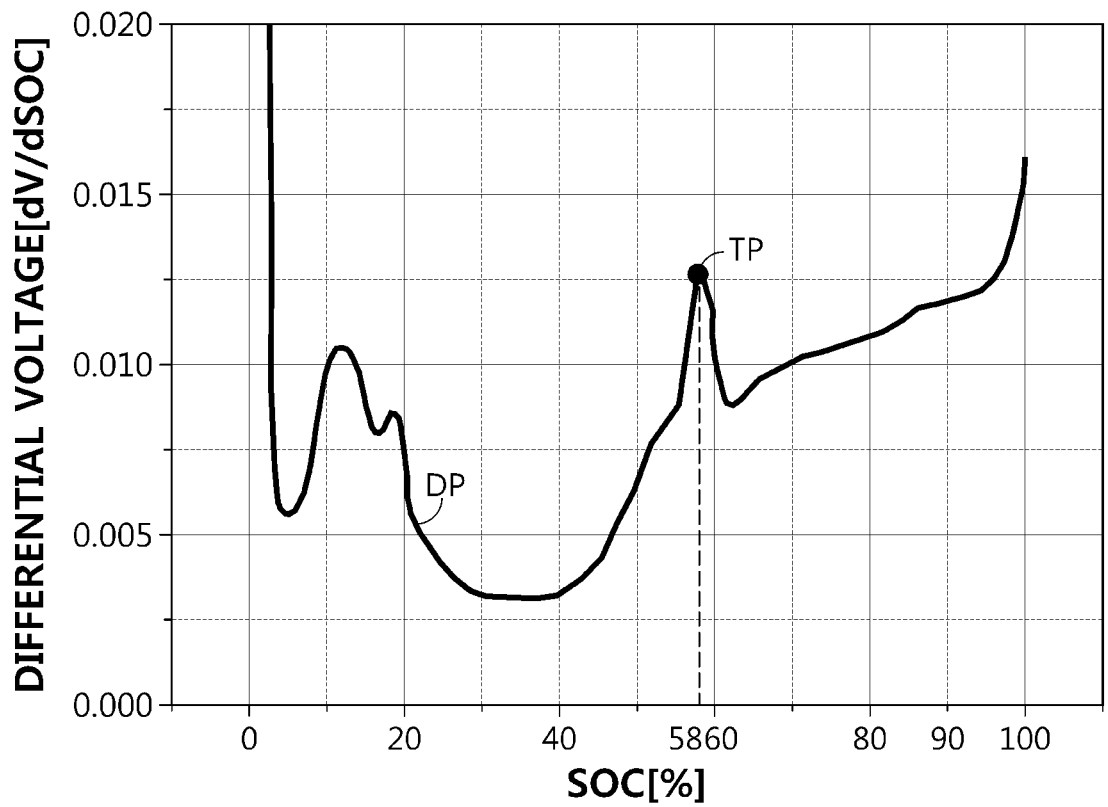
FIG. 4 is a diagram schematically showing a differential profile according to an embodiment of the present disclosure.

FIG. 4 is a diagram schematically showing a differential profile DP according to an embodiment of the present disclosure. Specifically, FIG. 4 may be a differential profile DP corresponding to the battery profile BP of FIG. 2.

For example, referring to FIGS. 2 and 4, the control unit 120 may generate a differential profile DP representing the corresponding relationship between the SOC and the differential voltage based on the battery profile BP. As another example, the differential profile DP may be stored in advance in the storage unit 140, and the control unit 120 may access the storage unit 140 to acquire the differential profile DP. As another example, the control unit 120 may acquire the differential profile DP by receiving the differential profile DP from the outside.

The control unit 120 may be configured to determine a target peak TP included in the predetermined SOC section from the acquired differential profile DP.

Specifically, the differential profile DP may include a plurality of peaks. Here, the peak is a point at which the instantaneous change rate of the differential voltage with respect to the SOC is 0 in the differential profile DP, and may be a point at which the instantaneous change rate changes from positive to negative based on the peak. That is, the peak may be a point having an upward convex form in the differential profile DP.

The control unit 120 may determine a peak included in a predetermined SOC section among the plurality of peaks included in the differential profile DP as the target peak TP. Preferably, the predetermined SOC section may be preset to include the SOC at which the negative electrode flat section F starts in the negative electrode profile NP of the battery cell.

For example, referring to FIGS. 2 and 4, the predetermined SOC section may be preset as a section of 50% SOC to 60% SOC. In addition, in the embodiment of FIG. 4, the control unit 120 may determine a peak located at 58% SOC among the plurality of peaks included in the differential profile DP as the target peak TP.

In addition, the control unit 120 may be configured to set the SOC corresponding to the determined target peak TP as the criterion SOC.

For example, in the embodiment of FIG. 4, the control unit 120 may set SOC 58% corresponding to the target peak TP as the criterion SOC. That is, the target peak TP may be a peak corresponding to the point at which the negative electrode flat section F starts in the negative electrode profile NP of the battery cell.

More preferably, the control unit 120 may set the criterion SOC in consideration of both the battery profile BP and the differential profile DP.

For example, the control unit 120 may determine the SOC at the point where the negative electrode flat section F starts in the negative electrode profile NP of the battery cell, and determine the SOC corresponding to the target peak TP in the differential profile DP. In addition, if two determined SOCs are the same, the control unit 120 may set the determined SOC as the criterion SOC. If the two SOCs determined by the control unit 120 are not the same, the control unit 120 may set the SOC determined based on the differential profile DP as the criterion SOC.

Hereinafter, an embodiment in which the control unit 120 determines the negative electrode side reaction factor will be described.

The control unit 120 may be configured to determine the negative electrode side reaction factor for the battery cell based on a capacity deviation.

Specifically, the control unit 120 may estimate the first SOC from the first voltage of the battery cell B1 at the first time point T1 using the battery profile BP. In addition, the control unit 120 may calculate the first capacity corresponding to the first SOC based on the BOL capacity Q0 of the BOL battery cell B0.

For example, in the embodiment of FIG. 3, the capacity of the battery cell B1 at the first time point T1 may be calculated as Q1 [mAh].

In addition, the control unit 120 may control the discharging unit 130 to discharge the battery cell B2 at the second time point T2. While the battery cell B2 is being discharged by the discharging unit 130, the measuring unit 110 may measure a discharging current of the battery cell B2 to calculate a discharging amount. Here, the discharging amount is the remaining capacity of the battery cell B2 at the second time point T2.

For example, in the embodiment of FIG. 3, the measuring unit 110 may calculate the capacity of the battery cell B1 at the second time point T2 as Q2 [mAh].

The control unit 120 may calculate a capacity deviation Qi by calculating a difference between the first capacity Q1 and the second capacity Q2. That is, the capacity deviation Qi may be a capacity change amount of the battery cell from the first time point T1 to the second time point T2. More specifically, the capacity deviation Qi may be a self-discharging amount of the battery cell from the first time point T1 to the second time point T2.

The control unit 120 may determine the calculated capacity deviation Qi as a negative electrode side reaction factor for the battery cell.

Figure 5:
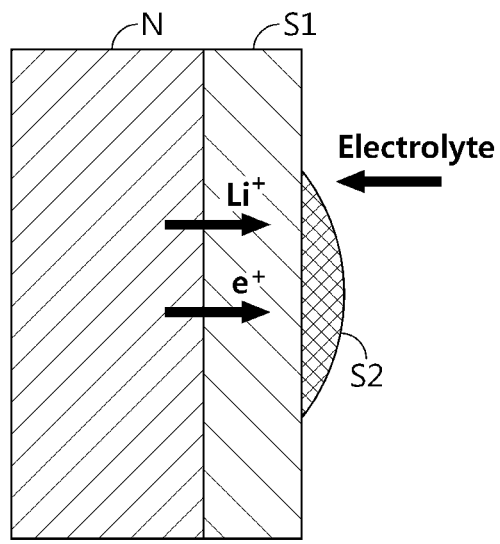
FIG. 5 is a diagram schematically showing a side reaction that may generated in the battery cell according to an embodiment of the present disclosure.

FIG. 5 is a diagram schematically showing a side reaction that may generated in the battery cell according to an embodiment of the present disclosure.

Referring to FIG. 5, in the negative electrode N of the battery cell, as lithium ion (Li+) and electron (e−) are consumed, a SEI (Solid Electrolyte Interphase) Si may be generated. After that, if lithium ion (Li+) is further supplied to the negative electrode N from the electrolyte, SEI S2 may be generated more on the surface of the generated SEI S1. That is, when a side reaction occurs at the negative electrode N of the battery cell, since lithium ion (Li+) and electron (e−) contained in the battery cell may be irreversibly reduced, the control unit 120 may determine the negative electrode side reaction factor based on the calculated capacity deviation Qi.

In summary, the control unit 120 may calculate the capacity deviation Qi according to the difference between the capacity Q1 of the battery cell B1 at the first time point T1 and the capacity Q2 of the battery cell B2 at the second time point T2, and determine the calculated capacity deviation Qi as a negative electrode side reaction factor. In addition, if the first SOC of the battery cell B1 at the first time point T1 is equal to or greater than the criterion SOC, the control unit 120 may determine the calculated voltage-based capacity based on the voltage deviation of the battery cell at the first time point T1 and the second time point T2 as a positive electrode side reaction factor. Conversely, if the first SOC is less than the criterion SOC, the control unit 120 may determine a value obtained by subtracting the capacity deviation Qi from the voltage-based capacity as a positive electrode side reaction factor.

The battery management apparatus 100 according to an embodiment of the present disclosure may determine the positive electrode side reaction factor in consideration of the voltage of the battery cell B1 at the first time point T1 at which the battery cell starts to be stored, and determine the negative electrode side reaction factor in consideration of the capacity change amount (e.g., self-discharging amount) while the battery cell is being stored. Therefore, the battery management apparatus 100 has an advantage of specifically distinguishing and determining the positive electrode side reaction factor for the positive electrode side reaction of the battery cell and the negative electrode side reaction factor for the negative electrode side reaction.

The control unit 120 may be configured to set an operating condition for the battery cell based on the type of the side reaction judged for the battery cell.

Specifically, since the conditions under which the positive electrode side reaction occurs well and the conditions under which the negative electrode side reaction occurs well are different, the control unit 120 may set the operating conditions for the battery cell differently depending on the side reaction type of the battery cell. That is, in order to effectively prevent further degradation of the battery cell, the control unit 120 may appropriately set the operating condition of the battery cell according to the side reaction type of the battery cell.

For example, when the type of the side reaction of the battery cell is judged as the positive electrode side reaction, the control unit 120 may be configured to reduce at least one of an upper limit SOC (allowable maximum SOC) and an upper limit voltage (allowable maximum voltage) for the battery cell.

Conversely, the control unit 120 may be configured to reduce an upper limit temperature (allowable maximum temperature) for the battery cell, when the type of the side reaction of the battery cell is judged as the negative electrode side reaction.

That is, the control unit 120 may set an optimal operating condition for the battery cell to correspond to the judged type of the side reaction of the battery cell. The operating condition set in this way may be stored in the storage unit 140 and/or the control unit 120, and may be considered in the process of operating the corresponding battery cell. That is, since the corresponding battery cell is operated according to the operating condition set by the control unit 120, it is possible to prevent an unexpected side reaction from being additionally generated in the battery cell and thus rapidly degrading the battery cell.

Also, the operating condition set by the control unit 120 may be stored in an external server. The external server may induce the corresponding battery cell to operate according to the set operating condition by transmitting the set operating condition to a device or system in which the corresponding battery cell is provided.

Meanwhile, the battery cell may be configured to be maintained at a predetermined temperature or above from the first time point T1 to the second time point T2. For example, the predetermined temperature may be a temperature of 40° C. or above.

In general, when a battery cell is exposed to high temperature, a side reaction may occur. Specifically, when the battery cell is exposed to high temperature, the electrolyte contained in the battery cell may be decomposed, and lithium ion (Li+) contained in the electrolyte may be supplied to the positive electrode and/or the negative electrode. In this case, the high potential (high SOC) capacity of the positive electrode supplied with lithium ion (Li+) from the electrolyte may not be used. In addition, the SEI S2 described in FIG. 5 may be further generated at the negative electrode supplied with lithium ion (Li+) from the electrolyte.

Therefore, when the condition under which a side reaction may occur (e.g., a predetermined temperature maintenance condition) is satisfied in the process of storing the battery cell, the battery management apparatus 100 according to an embodiment of the present disclosure may specifically judge whether the occurrence of the positive electrode side reaction in the battery cell is predominant or whether the occurrence of the negative electrode side reaction is predominant In addition, the battery management apparatus 100 may appropriately set the operating condition for a battery cell that satisfies the temperature maintenance condition.

The battery management apparatus 100 according to the present disclosure may be applied to a BMS (Battery Management System). That is, the BMS according to the present disclosure may include the battery management apparatus 100 described above. In this configuration, at least some of the components of the battery management apparatus 100 may be implemented by supplementing or adding functions of the configuration included in the conventional BMS. For example, the measuring unit 110, the control unit 120, the discharging unit 130 and the storage unit 140 may be implemented as components of the BMS.

The battery management apparatus 100 may be applied not only to the BMS but also to a battery storage system.

Here, the battery storage system may be a system capable of storing the battery cell from the first time point T1 to the second time point T2.

For example, the manufactured battery cell may be loaded in a storage space such as a container and shipped. The battery management apparatus 100 may be applied to the battery storage system and diagnose the state of the battery cell stored as a no-load state from the first time point T1 to the second time point T2. Specifically, the battery management apparatus 100 may specifically judge the type of the side reaction occurring in the battery cell while the battery cell is being stored in the no-load state, and set an operating condition suitable for each battery cell. Accordingly, as the corresponding battery cell is operated according to the operating condition set by the battery management apparatus 100, it is possible to effectively prevent an additional side reaction from occurring. Through this, as degradation of the battery cell may be effectively prevented, the life expectancy of the battery cell may be dramatically increased.

Figure 6:
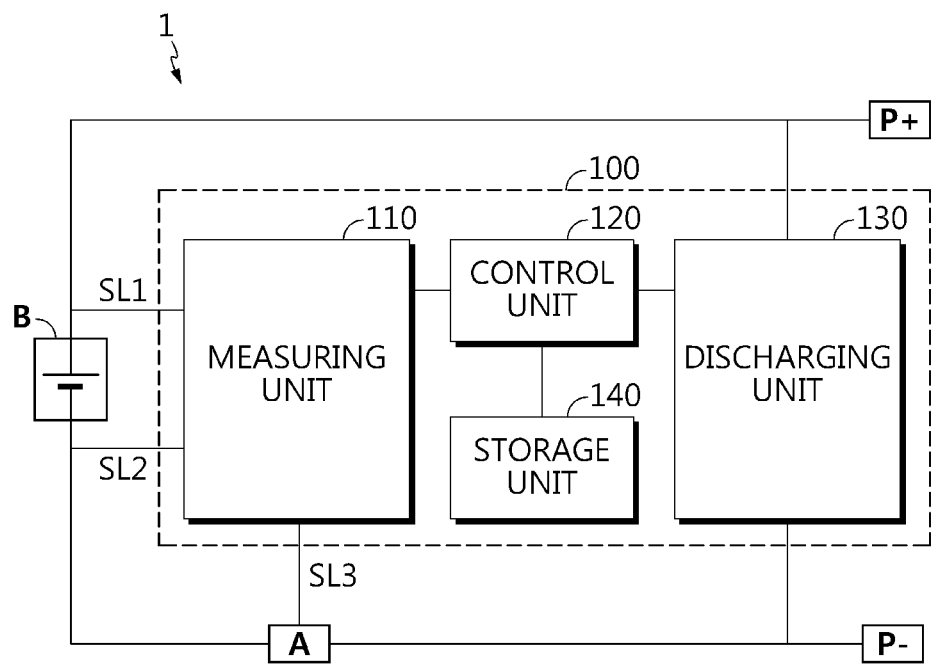
FIG. 6 is a diagram schematically showing a battery pack according to another embodiment of the present disclosure.

FIG. 6 is a diagram schematically showing a battery pack 1 according to another embodiment of the present disclosure.

In addition, the battery management apparatus 100 according to the present disclosure may be provided in a battery pack 1. That is, the battery pack 1 according to the present disclosure may include the above-described battery management apparatus 100 and one or more battery cells B. In addition, the battery pack 1 may further include electrical equipment (relays, fuses, etc.) and a case. The battery pack 1 may be applied to a battery storage system, a vehicle, an ESS (Energy Storage System), and the like.

In the embodiment of FIG. 6, the measuring unit 110 may be connected to a first sensing line SL1, a second sensing line SL2, and a third sensing line SL3. The measuring unit 110 may measure the positive electrode voltage of the battery cell B through the first sensing line SL1, and measure the negative electrode voltage of the battery cell B through the second sensing line SL2. In addition, the measuring unit 110 may measure the voltage of the battery cell B by calculating a difference between the measured positive electrode voltage and the measured negative electrode voltage.

In addition, the measuring unit 110 may be connected to a current measuring unit A through the third sensing line SL3. The current measuring unit A may be provided on the charging and discharging path of the battery cell B. For example, the current measuring unit A may be a current meter or a shunt resistor.

In addition, the charging and discharging path may be a high current path through which the charging current and the discharging current of the battery cell B flow. Accordingly, the measuring unit 110 may measure the current of the battery cell B through the third sensing line SL3 connected to the current measuring unit A, and measure the capacity of the battery cell B based on the measured current.

In addition, the discharging unit 130 may include a switching element and a discharging resistor that constitute a discharging path of the battery cell B. Both ends of the discharging unit 130 may be connected to the charging and discharging path of the battery cell B.

For example, one end of the discharging unit 130 may be connected to the positive electrode of the battery cell B in the charging and discharging path. In addition, the other end of the discharging unit 130 may be connected to the negative electrode of the battery cell B in the charging and discharging path. In addition, the switching element included in the discharging unit 130 may open or close the discharging path for the battery cell B as its the operating state is controlled by the control unit 120.

For example, in the embodiment of FIG. 3, the discharging unit 130 may completely discharge the battery cell B2 at the second time point T2 to SOC 0%. In this discharging process, the measuring unit 110 may measure the second capacity Q2 of the battery cell B.

Figure 7:
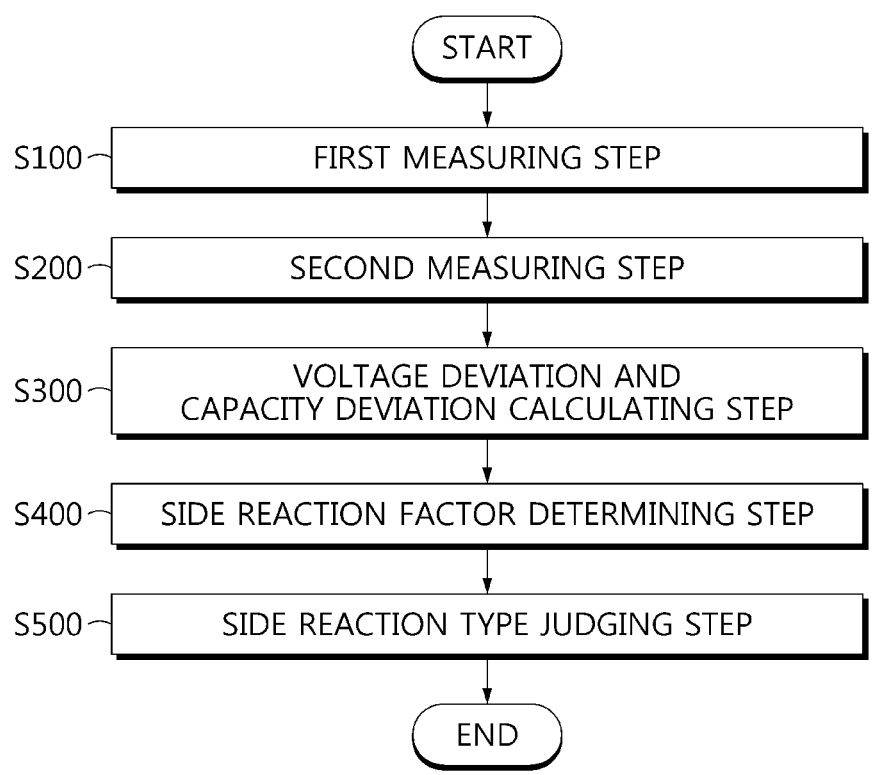
FIG. 7 is a diagram schematically showing a battery management method according to still another embodiment of the present disclosure.

FIG. 7 is a diagram schematically showing a battery management method according to still another embodiment of the present disclosure.

Preferably, each step of the battery management method may be performed by the battery management apparatus 100. Hereinafter, for convenience of description, contents overlapping with the previously described contents will be omitted or briefly described.

Referring to FIG. 7, the battery managing method includes a first measuring step (S100), a second measuring step (S200), a voltage deviation and capacity deviation calculating step (S300), a side reaction factor determining step (S400) and a side reaction type judging step (S500).

The first measuring step (S100) is a step of measuring a first voltage of a battery cell B1 at a first time point T1, and may be performed by the measuring unit 110.

For example, the first time point T1 may be a time point immediately before the battery cell B1 is stored. That is, the measuring unit 110 may measure the first voltage of the battery cell B1 at the first time point T1 at which the battery cell B1 starts to be stored.

The second measuring step (S200) is a step of measuring a second voltage and a second capacity of the battery cell at a second time point T2 later than the first time point T1, and may be performed by the measuring unit 110.

For example, the second time point T2 may be a time point at which the battery cell B2 is completely stored. Similar to the process of measuring the voltage of the battery cell B1 at the first time point T1, the measuring unit 110 may measure the voltage of the battery cell B2 at the second time point T2.

Also, the control unit 120 may control the discharging unit 130 to discharge the battery cell B2. In the process of discharging the battery cell B2, the measuring unit 110 may measure the discharging current of the battery cell B2, and accumulate the measured discharging currents to measure the second capacity corresponding to the discharging amount of the battery cell B2.

The voltage deviation and capacity deviation calculating step (S300) is a step of calculating a voltage deviation between the first voltage and the second voltage, and calculating a capacity deviation between a first capacity corresponding to the first voltage and the second capacity, and may be performed by the control unit 120.

The control unit 120 may calculate the voltage deviation by calculating a difference between the first voltage of the battery cell B1 at the first time point T1 and the second voltage of the battery cell B2 at the second time point T2. For example, the control unit 120 may calculate the voltage deviation by calculating a formula of "first voltage–second voltage".

The control unit 120 may calculate the capacity deviation by calculating a difference between the first capacity of the battery cell B1 at the first time point T1 and the second capacity of the battery cell B2 at the second time point T2. For example, the control unit 120 may calculate the capacity deviation by calculating a formula of "first capacity–second capacity".

Here, the control unit 120 may calculate the first capacity based on the first voltage. Specifically, the control unit 120 may estimate a first SOC corresponding to the first voltage using the battery profile BP. In addition, the control unit 120 may calculate the first capacity corresponding to the first voltage by using the capacity Q0 of the BOL battery cell B0 and the estimated first SOC.

The side reaction factor determining step (S400) is a step of determining a positive electrode side reaction factor and a negative electrode side reaction factor for the battery cell based on the voltage deviation and the capacity deviation, and may be performed by the control unit 120.

Specifically, the control unit 120 may calculate a capacity deviation Qi according to the difference between the capacity Q1 of the battery cell B1 at the first time point T1 and the capacity Q2 of the battery cell B2 at the second time point T2, and convert the calculated capacity deviation Qi as the negative electrode side reaction factor.

In addition, if the first SOC of the battery cell B1 at the first time point T1 is greater than or equal to a criterion SOC, the control unit 120 may determine a voltage-based capacity based on the voltage deviation of the battery cell at the first time point T1 and the second time point T2 as a positive electrode side reaction factor. Here, the voltage deviation means a deviation between the first voltage of the battery cell B1 at the first time point T1 and the second voltage of the battery cell B2 at the second time point T2. The control unit 120 may calculate the voltage-based capacity by converting the voltage deviation into a capacity-based value using the battery profile BP.

Conversely, if the first SOC is less than the criterion SOC, the control unit 120 may determine a value obtained by subtracting the capacity deviation Qi from the voltage-based capacity as a positive electrode side reaction factor. As described above, if the first SOC is less than the criterion SOC, the capacity deviation Qi corresponding to the negative electrode side reaction may be included in the voltage-based capacity. Therefore, in order to accurately determine the positive electrode side reaction factor, the control unit 120 may determine a value obtained by subtracting the capacity deviation Qi from the voltage-based capacity as a positive electrode side reaction factor.

The side reaction type judging step (S500) is a step of judging the type of the side reaction of the battery cell based on the positive electrode side reaction factor and the negative electrode side reaction factor, and may be performed by the control unit 120.

For example, the control unit 120 may calculate a formula of "positive electrode side reaction factor÷negative electrode side reaction factor" to calculate a side reaction reference value. In addition, if the side reaction reference value is equal to or greater than the criterion value, the control unit 120 may judge the side reaction type of the battery cell as a positive electrode side reaction. As another example, if the side reaction reference value is less than the criterion value, the control unit 120 may judge the side reaction type of the battery cell as a negative electrode side reaction.

The battery managing method according to still another embodiment of the present disclosure may further include an operating condition setting step (not shown).

The operating condition setting step is a step of setting an operating condition for the battery cell based on the type of the side reaction judged for the battery cell after the side reaction type judging step (S500), and may be performed by the control unit 120.

Specifically, since the conditions under which the positive electrode side reaction occurs well and the conditions under which the negative electrode side reaction occurs well are different, the control unit 120 may set the operating conditions for the battery cell differently depending on the side reaction type of the battery cell. That is, in order to effectively prevent further degradation of the battery cell, the control unit 120 may appropriately set the operating condition of the battery cell according to the side reaction type of the battery cell.

For example, when the type of the side reaction of the battery cell is judged as a positive electrode side reaction, the control unit 120 may be configured to reduce at least one of an upper limit SOC (allowable maximum SOC) and an upper limit voltage (allowable maximum voltage) for the battery cell.

Conversely, the control unit 120 may be configured to reduce an upper limit temperature (allowable maximum temperature) for the battery cell, when the type of the side reaction of the battery cell is judged as a negative electrode side reaction.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

Reference Signs

1: battery pack
100: battery management apparatus
110: measuring unit
120: control unit
130: discharging unit
140: storage unit

What is claimed is:

1. A battery management apparatus, comprising:
  a voltage sensor configured to measure a first voltage of a battery cell at a first time point and a second voltage of the battery cell at a second time point later than the first time point;
  a current sensor configured to measure a current of the battery cell and calculate a second capacity of the battery cell based on measured current from the first time point to the second time point;
  a controller configured to communicably connect to the voltage sensor and the current sensor; and
  memory having programmed thereon instructions that, when executed by the controller, cause the controller to:
  calculate a voltage deviation between the first voltage and the second voltage measured by the voltage sensor;
  calculate a capacity deviation between a first capacity corresponding to the first voltage and the second capacity;
  determine a positive electrode side reaction factor and a negative electrode side reaction factor for the battery cell based on the voltage deviation and the capacity deviation; and
  determine a type of a side reaction of the battery cell based on the positive electrode side reaction factor and the negative electrode side reaction factor.

2. The battery management apparatus according to claim 1, wherein the instructions are configured to cause the controller to:
calculate a voltage-based capacity corresponding to the voltage deviation based on a battery profile representing a corresponding relationship between state of charge (SOC) and voltage of the battery cell; and
determine the positive electrode side reaction factor based on the voltage-based capacity.

3. The battery management apparatus according to claim 2,
wherein the instructions are configured to cause the controller to:
estimate a first SOC corresponding to the first voltage;
compare the estimated first SOC with a preset criterion SOC; and
determine the positive electrode side reaction factor of the battery cell to correspond to the comparison result.

4. The battery management apparatus according to claim 3, wherein the instructions are configured to cause the controller to:
in response to the first SOC being equal to or greater than the preset criterion SOC, determine the positive electrode side reaction factor is the voltage-based capacity; and
in response to the first SOC being less than the preset criterion SOC, determine the positive electrode side reaction factor based on a difference between the voltage-based capacity and the capacity deviation.

5. The battery management apparatus according to claim 3, wherein the instructions are configured to cause the controller to set the preset criterion SOC in a differential profile representing a corresponding relationship between the SOC of the battery cell and a differential voltage for the SOC at a point of the differential profile at which a negative electrode flat section starts.

6. The battery management apparatus according to claim 5,
wherein the instructions are configured to cause the controller to:
determine a target peak included in a predetermined SOC section in the differential profile; and
set the preset criterion SOC to the determined target peak.

7. The battery management apparatus according to claim 1,
wherein the instructions are configured to cause the controller to determine the negative electrode side reaction factor for the battery cell based on the capacity deviation.

8. The battery management apparatus according to claim 1,
wherein the instructions are configured to cause the controller to:
calculate a side reaction reference value based on the positive electrode side reaction factor and the negative electrode side reaction factor;
compare the calculated side reaction reference value with a preset side reaction threshold value; and
determine the type of the side reaction of the battery cell to be one of a positive electrode side reaction or a negative electrode side reaction based on the comparison.

9. The battery management apparatus according to claim 1,
wherein the instructions are configured to cause the controller to set an operating condition for the battery cell, based on the determined type of the side reaction of the battery cell.

10. The battery management apparatus according to claim 9,
wherein the instructions are configured to cause the controller to:
reduce at least one of an upper limit SOC or an upper limit voltage for the battery cell in response to the determined type of the side reaction of the battery cell being the positive electrode side reaction; and
reduce an upper limit temperature for the battery cell in response to the determined type of the side reaction of the battery cell being the negative electrode side reaction.

11. The battery management apparatus according to claim 1,
wherein the current sensor is configured to measure the second capacity by measuring a discharging current amount of the battery cell at the second time point while the battery cell is being discharged.

12. The battery management apparatus according to claim 1,
wherein the battery cell is configured to maintain at a predetermined temperature or above from the first time point to the second time point.

13. A battery pack, comprising the battery management apparatus according to claim 1.

14. A battery management method, comprising:
measuring, by a voltage sensor, a first voltage of a battery cell at a first time point and a second voltage of the battery at a second time point later than the first time point;
measuring, by a current sensor, a current of the battery cell;
calculating, by the current sensor, a second capacity of the battery cell based on measured current from the first time point to the second time point;
calculating, by the controller, a voltage deviation between the first voltage and the second voltage measured by the voltage sensor;
calculating, by the controller, a capacity deviation between a first capacity corresponding to the first voltage and the second capacity;
determining, by the controller, a positive electrode side reaction factor and a negative electrode side reaction factor for the battery cell based on the voltage deviation and the capacity deviation; and
determining, by the controller, a type of a side reaction of the battery cell based on the positive electrode side reaction factor and the negative electrode side reaction factor.

* * * * *